US005759432A

United States Patent [19]
Kumar et al.

[11] Patent Number: 5,759,432
[45] Date of Patent: Jun. 2, 1998

[54] RELAXOR FERROELECTRIC COMPOSITIONS FOR FIELD INDUCED ULTRASONIC TRANSDUCERS

[75] Inventors: Umesh Kumar, Surfside Beach, S.C.; Wayne Huebner, Rolla, Mo.; Sea Fue Wang, Brookfield, Conn.

[73] Assignee: Penn State Research Foundation, University Park, Pa.

[21] Appl. No.: 663,729

[22] Filed: Jun. 14, 1996

[51] Int. Cl.$^6$ .................... C04B 35/495; C04B 35/472; H02K 47/04
[52] U.S. Cl. .................... 252/62.9 R; 501/135; 501/136; 310/113
[58] Field of Search ............... 252/62.9 R; 501/135, 501/136; 310/311

[56] References Cited

U.S. PATENT DOCUMENTS

| | | | |
|---|---|---|---|
| 5,345,139 | 9/1994 | Gururaja et al. | 310/338 |
| 5,378,382 | 1/1995 | Nishimura et al. | 252/62.9 |
| 5,438,554 | 8/1995 | Seyed-Bolorforosh et al. | 367/140 |

FOREIGN PATENT DOCUMENTS

| | | | |
|---|---|---|---|
| 55-111011 | 8/1980 | Japan | 501/135 |
| 55-116662 | 9/1980 | Japan | 501/135 |
| 55-144611 | 11/1980 | Japan | 501/136 |
| 55-144612 | 11/1980 | Japan | 501/136 |
| 4-26005 | 1/1992 | Japan | 501/135 |
| 5-290625 | 11/1993 | Japan | 501/136 |

*Primary Examiner*—Melissa Bonner
*Attorney, Agent, or Firm*—Ratner & Prestia

[57] ABSTRACT

A relaxor ferroelectric composition that has the components lead magnesium niobate, lead titanate, and lead magnesium tungstate. The components are preferably present in relative molar amounts of (1−x−y) lead magnesium niobate, (x) lead titanate, and (y) lead magnesium tungstate, where $0.11 \leq x \leq 0.13$ and $0.01 \leq y \leq 0.03$. Also disclosed is a tunable ultrasonic transducer made of a relaxor ferroelectric composition that has the components lead magnesium niobate, lead titanate, and lead magnesium tunstate. A method of making a relaxor ferroelectric material comprising the step of adding an effective amount of lead magnesium tungstate to a lead magnesium niobate-lead titanate composition is also disclosed.

7 Claims, No Drawings

RELAXOR FERROELECTRIC COMPOSITIONS FOR FIELD INDUCED ULTRASONIC TRANSDUCERS

FIELD OF THE INVENTION

The present invention relates to relaxor ferroelectric compositions and, more particularly, to a new relaxor ferroelectric composition particularly useful in ultrasonic transducer applications.

BACKGROUND OF THE INVENTION

Ultrasonic transducers are commonly used to analyze the interior of an object non-destructively. Imaging internal organs of the human body, such as the heart or the kidneys, for diagnostic purposes is a typical example.

Transducers are typically formed of piezoelectric materials capable of generating ultrasonic waves. The piezoelectric materials convert electrical energy into mechanical energy to generate acoustic waves. The waves are sent into the body being imaged and reflect off objects within the body. The piezoelectric material then receives the reflected acoustic signals and converts them into electrical signals which may be sent to an imaging device.

A known exemplary piezoelectric transducer material is lead zirconate titanate (PZT) ceramic. This material is formed from a PZT-based starting composition that is sintered, along with various dopants, into a dense polycrystalline ceramic.

To induce piezoelectric properties in a PZT ceramic, and materials similar to it, the ceramic is polarized by applying d.c. voltage. In its polarized state, the ceramic exhibits the piezoelectric properties. The acoustic waves that are generated by the ceramic transducer are within a frequency range that is dependent upon the properties of the specific material used for the transducer.

A material that exhibits piezoelectric properties is in what is known as the ferroelectric phase. When a material does not exhibit those properties, it is in the paraelectric phase.

Upon removal of an applied d.c. voltage, "normal" piezoelectric materials, such as the PZT ceramic mentioned above, exhibit a remnant polarization at temperatures below $T_d$, the temperature at which polarization (and hence piezoelectric effect) disappears. This means that the material remains polarized at these temperatures even after the d.c. bias voltage is removed. The material thus cannot be "tuned" on and off by applying and removing a d.c. bias voltage. The piezoelectric activity, and consequently the sensitivity, of these materials is relatively constant.

Another class of materials, known as "relaxor" ferroelectric materials, are actively pursued for transducer applications. In these materials, above temperature $T_d$, the piezoelectric phenomenon is present only when a d.c. bias is being applied. That is, there is little or no remnant polarization above $T_d$, so that when the d.c. bias is removed, piezoelectric behavior stops instantly. Most importantly, only a modest voltage need be applied to induce the piezoelectric behavior.

Thus, it is possible to construct transducers of relaxor ferroelectric materials that have variable sensitivity in piezoelectric properties responsive to the applied d.c. bias. Such transducers are referred to as "tunable" because they can be turned on and off by applying and removing a modest d.c. bias voltage.

An important property of a transducer material is its dielectric constant K. In general, the highest possible dielectric constant K is desirable. Dielectric constant K is temperature dependent. Maximum dielectric constant $K_{max}$ occurs at a temperature $T_{max}$. For relaxor ferroelectric materials, $T_{max}$ is considerably above $T_d$. In the temperature range $(T_{max}-T_d)$, relaxor ferroelectric materials not only are tunable using only a modest electric field, but also show a high dielectric constant K in that range.

Another important property of a transducer material is thickness electromechanical coupling coefficient $k_t$. Thickness electro-mechanical coupling coefficient $k_t$ is calculated from the electro-mechanical resonance and anti-resonance frequencies of the transducer, which may be measured by resonance techniques. The coupling coefficient $k_t$ represents the conversion efficiency of electrical energy to mechanical energy. Thus, for materials having a $k_t$ of 0.45–0.47, only 45% to 47% of the energy is effective for useful work, and the rest is dissipated as heat. To avoid excessive heating and property degradation, $k_t$ should be as high as possible.

Another property of a transducer material is the remnant thickness electromechanical coupling coefficient $k_t$rem, which is the electro-mechanical coupling coefficient remaining after a d.c. bias is removed from a material. For practical applications, $k_t$rem should be less than 0.15 for effective tunability.

In some ultrasound transducer applications, particularly in the medical field, the transducer material is designed to operate at room temperature. For relaxor ferroelectric materials, this means that the tunable range $(T_{max}-T_d)$ of the material should encompass room temperature. Because room temperature may vary depending on the geographical location, air conditioning, or localized heating of a transducer itself, $(T_{max}-T_d)$ should be as broad as possible, preferably covering the range from 10° C. to 40° C. The properties of a transducer material should be optimized for this temperature range. In particular, a high dielectric constant and a high electro-mechanical coupling coefficient induced by moderate d.c. fields are most desirable, along with low dielectric loss (tanδ<5%), high density, and small grain size.

Specific relaxor ferroelectric materials considered for medical ultrasound transducers are lead magnesium niobate-lead titanate compositions (PMN-PT); lead zinc niobate-lead titanate-barium titanate compositions; and lead lanthanum zirconate titanate compositions. U.S. Pat. No. 5,345,139, issued to Gururaja et al., discloses a PMN-PT composition doped with lanthanum, which produces a wider operating range $(T_{max}-T_d)$.

It is desirable to improve the properties of transducers operating in a wide temperature range around room temperature beyond those shown by the known materials, however. In particular, raising the electro-mechanical coupling coefficient $k_t$ at given applied d.c. biases is desirable. Raising $k_t$ improves the efficiency of the transducer and avoids excess heating. These properties are also desirable in other applications in which relaxor ferroelectric materials are used.

SUMMARY OF THE INVENTION

The present invention is a relaxor ferroelectric composition that has the components lead magnesium niobate, lead titanate, and lead magnesium tungstate. The components are preferably present in relative molar amounts of (1−x−y) lead magnesium niobate, (x) lead titanate, and (y) lead magnesium tungstate, where 0.11<x<0.13 and 0.01<y<0.03.

The invention also provides a tunable ultrasonic transducer made of a relaxor ferroelectric composition that has the components lead magnesium niobate, lead titanate, and lead magnesium tungstate.

In another aspect, the invention involves a method of making a relaxor ferroelectric material comprising the step of adding an effective amount of lead magnesium tungstate to a lead magnesium niobate-lead titanate composition.

DETAILED DESCRIPTION OF THE INVENTION

The present invention is a new relaxor ferroelectric composition useful as, for example, an ultrasonic transducer. The composition includes lead magnesium niobate, lead titanate, and lead magnesium tungstate (PMW). Such a composition yields desirable properties over a wide temperature range around room temperature.

Various exemplary compositions according to the present invention were prepared using a coulumbite precursor method as follows.

First, magnesium niobate ($MgNb_2O_6$) and magnesium tungstate ($MgWO_4$) precursors were prepared. To form the magnesium niobate precursor appropriate stoichiometric amounts of magnesium oxide (MgO) and niobium oxide ($Nb_2O_5$) were mixed in a ball mill for 24 hours with ethyl alcohol and ½" $ZrO_2$ milling media. After drying, the mixture was calcined in a covered alumina crucible at 1000° C. for 10 hours. The calcined product was homogenized and recalcined at 1100° C. for 10 hours to improve the phase purity. After the second calcination, the powder was ball milled and dried.

The magnesium tungstate precursor was prepared by calcining an appropriate stoichiometric mixture of MgO and tungstic oxide ($WO_3$) at 1000° C. for 10 hours, and the product was ball milled and dried before further use.

Appropriate stoichiometric amounts of litharge (PbO), $MgNb_2O_6$, $MgWO_4$, and titanium dioxide ($TiO_2$) were then mixed in a ball mill for 24 hours. After drying, the mixture was calcined at 950°–960° C. for 2–5 hours in a closed alumina crucible. The calcined powder was ground in a ball mill for 24 hours. After drying, it was mixed with 5 weight % of DuPont®5200 organic binder and was passed through a 100 mesh sieve. Several ½" pellets were prepared in a steel die by applying a uniaxial pressure of 24,000–26,000 psi. The binder was evaporated from the pellets by heating them to 300° C. for 2 hours and 500° C. for 5 hours. After the binder removal, the green pellets were sintered at 1,175°–1, 250° C. for 1–4 hours over a platinum sheet in a closed alumina crucible. A mixture of PbO-$ZrO_2$ powder was used as a source to saturate the crucible atmosphere with PbO vapor. After sintering, the pellets were annealed at 900°–950° C. for 1–5 hours. The sintered pellets were polished to appropriate thicknesses and given electrical characterization using electrodes.

Twelve different compositions were prepared using this method. These compositions are labeled as compositions a–l in Table 1, which gives the composition in mole percent of the components. In general, the compositions have a formula (1–x–y)PMN–(x)PT–(y)PMW, where x=0.07–0.13 and y=0.00–0.03.

For each composition, $T_{max}$ and K were measured at a frequency of one kilohertz with no d.c. bias applied. K and $k_t$ were specifically measured at 20° C., an approximation of room temperature, with eight kilovolts per centimeter of d.c. voltage applied during the measuring of $k_t$. The results are presented in Table 1.

Table 2 presents various $k_t$ measurements for two of the compositions taken at 10° C., 20° C., and 50° C., with different applied d.c. voltages of three, five, and eight kilovolts per centimeter. The remnant electro-mechanical coupling coefficient $k_t$rem was also measured and is presented in Table 2.

The data presented in Table 1 show that compositions b–j, those with PMW included, had many desirable properties. For these compositions, the tunable operating range ($T_{max}–T_d$) is expanded to as much as 41° C., as shown for composition j. Compositions f–i show an operating range between 34° C. and 38° C. This means that temperature variations of 34° C. will not adversely affect the performance of transducers, low frequency actuators, or other devices made from these compounds.

The dielectric constant K for all of the compositions including PMW, compositions b–j, are above 12,000 at 20° C. Desirable K values at 20° C. are above 10,000. The K value for the exemplary compositions is as high as 18,950, as shown for composition j.

Most significantly, $k_t$ for the compositions b–j that include PMW appears to be generally elevated in comparison to the compositions a, k, and l that do not include PMW. For the compositions without PMW, $k_t$ is 0.46–0.48. For the exemplary compositions with PMW, $k_t$ ranges from 0.48–0.52.

Any elevation in $k_t$ is a direct benefit in the use of relaxor ferroelectric compositions. Because $k_t$ represents the conversion efficiency for converting electrical energy to mechanical energy, compositions with higher $k_t$ values are more efficient and hence less costly to operate. In applications for relaxor ferroelectric materials such as ultrasound transducers, this also results in reduced heating of the device and reduced property degradation.

Considering all of desirable factors and properties for relaxor ferroelectric materials, the data presented in Table 1 indicates that compositions f and i show the best overall performance. The $k_t$ values, along with the $k_t$rem values, for these two compositions at three different temperatures and various applied voltages are shown in Table 2. At 20° C., $k_t$rem for both of these compositions is zero, and $k_t$ is 0.51 at eight kilovolts per centimeter. The $k_t$ values for these compositions vary only 10% from the maximum value over the entire temperature span at the various voltages.

The tabulated properties for the exemplary compositions incorporating PMW illustrate that all of the compositions, and particularly compositions f and i, are quite suitable for use in applications, such as ultrasonic transducers and actuators, where such properties are desired. The compositions incorporating PMW provide a desired dielectric constant K over a broad temperature range with an elevated electro-mechanical coupling coefficient $k_t$ and low remnant coupling coefficient $k_t$rem.

Although described in connection with specific examples, the present invention is not intended to be limited thereto. Rather, the appended claims should be construed to encompass the present invention in its true spirit and full scope, including all such variants as may be made by those skilled in the art without departing therefrom.

What is claimed:

1. A tunable ultrasonic transducer comprising a relaxor ferroelectric composition of lead magnesium niobate, lead titanate, and lead magnesium tungstate as components, wherein the tunable ultrasonic transducer has following properties: (1) a dielectric constant greater than 10,000 measured at 20° C. at a frequency of one kilohertz with no d.c. bias applied; (2) a thickness coupling coefficient greater than 0.47 measured at 20° C. with eight kilovolts per centimenter of d.c. voltage applied; (3) a remnant thickness coupling coefficient less than 0.15; and (4) a tunable range encompassing room temperature.

2. A tunable ultrasonic transducer as claimed in claim 1 wherein said components are present in relative molar amounts of (1−x−y) lead magnesium niobate, (x) lead titanate, and (y) lead magnesium tungstate, where $0.11 \leq x \leq 0.13$ and $0.01 \leq y \leq 0.03$.

3. A tunable ultrasonic transducer as claimed in claim 1 wherein said components are present in relative molar amounts of (0.86) lead magnesium niobate, (0.12) lead titanate, and (0.02) lead magnesium tungstate.

4. A tunable ultrasonic transducer as claimed in claim 1 wherein said components are present in relative molar amounts of (0.87) lead magnesium niobate, (0.11) lead titanate, and (0.02) lead magnesium tungstate.

5. A method of making a relaxor ferroelectric material of lead magnesium tungstate, lead magnesium niobate, and lead-titanate comprising the steps of:

a) mixing and calcining stoichiometric amounts of magnesium oxide and niobium oxide to form a magnesium niobate precursor;

b) mixing and calcining stoichiometric amounts of magnesium oxide and tungstic oxide to form a magnesium tungstate precursor;

c) forming a mixture of desired stoichiometric amounts of said magnesium niobate precursor, said magnesium tungstate precursor, litharge, and titanium dioxide;

d) calcining and binding said mixture;

e) sintering said mixture in a saturated atmosphere of litharge vapor; and f) annealing said mixture to form said relaxor ferroelectric material.

6. A method of making a relaxor ferroelectric material as claimed in claim 5 wherein said step of forming a mixture of desired stoichiometric amounts comprises using amounts of said magnesium niobate precursor, said magnesium tungstate precursor, litharge, and titanium dioxide that produces a relaxor ferroelectric material having between one and three molar percent of lead magnesium tungstate.

7. A method of making a relaxor ferroelectric material as claimed in claim 5 wherein said step of forming a mixture of desired stoichiometric amounts comprises using amounts of said magnesium niobate precursor, said magnesium tungstate precursor, litharge, and titanium dioxide that produces a relaxor ferroelectric material having two molar percent of lead magnesium tungstate.

* * * * *

UNITED STATES PATENT AND TRADEMARK OFFICE
CERTIFICATE OF CORRECTION

PATENT NO. : 5,759,432
DATED : June 2, 1998
INVENTOR(S) : Kumar et al.

Page 1 of 2

It is certified that error appears in the above-identified patent and that said Letters Patent is hereby corrected as shown below:

In column 4, between lines 55 and 56 please insert Tables 1 and 2 as follows:

Table 1.: Electrical Properties of PMN/PT/PMW compositions.

| Sample | Composition | | | Tmax@1kHz (°C) | Td (°C) | Tmax-Td (°C) | Kmax 1 kHz | K @ 20°C 1 kHz | kt @ 20°C at 8 kV/cm |
|---|---|---|---|---|---|---|---|---|---|
| | PMN mole% | PT mole% | PMW mole% | | | | | | |
| a | 87 | 13 | 0 | 59 | 37 | 22 | 24400 | 24100 | 0.47 |
| b | 86 | 13 | 1 | 50 | 25 | 23 | 27400 | 17800 | 0.48 |
| c | 85 | 13 | 2 | 49 | 23 | 26 | 33100 | 12600 | 0.51 |
| d | 84 | 13 | 3 | 44 | 16 | 28 | 28600 | 13400 | 0.48 |
| e | 87 | 12 | 1 | 46 | 17 | 29 | 25700 | 13900 | 0.51 |
| f | 86 | 12 | 2 | 42 | 8 | 34 | 23340 | 14000 | 0.51 |
| g | 85 | 12 | 3 | 36 | -2 | 38 | 32500 | 17800 | 0.5 |
| h | 88 | 11 | 1 | 39 | 8 | 31 | 28900 | 16275 | 0.52 |
| i | 87 | 11 | 2 | 35 | -3 | 38 | 23800 | 10950 | 0.51 |
| j | 86 | 11 | 3 | 30 | -11 | 41 | 28300 | 13800 | 0.49 |
| k | 90 | 10 | 0 | 40 | 15 | 25 | 27000 | 17500 | 0.48 |
| l | 93 | 7 | 0 | 24 | -5 | 29 | 25300 | 14650 | 0.46 |

UNITED STATES PATENT AND TRADEMARK OFFICE
CERTIFICATE OF CORRECTION

PATENT NO. : 5,759,432
DATED : June 2, 1998
INVENTOR(S) : Kumar et al.

It is certified that error appears in the above-identified patent and that said Letters Patent is hereby corrected as shown below:

Table 2: Thickness coupling coefficient at various electric field and temperatures

| Composition | | | measurement Temperature T= 10°C | | | | measurement Temperature T= 20°C | | | | measurement Temperature T= 50°C | | | |
|---|---|---|---|---|---|---|---|---|---|---|---|---|---|---|
| PMN Mole% | PT mole% | PMW mole% | kt | | | | kt | | | | kt | | | |
| | | | @ 3kV/cm | @ 5 kV/cm | @ 8 kv/cm | kt rem. | @ 3kV/cm | @5 kV/cm | @ 8 kv/cm | kt rem. | @ 3kV/cm | @5 kV/cm | @ 8 kv/cm | kt rem |
| 87 | 11 | 2 | 0.4 | 0.51 | 0.51 | 0.11 | 0.38 | 0.5 | 0.51 | 0 | 0.18 | 0.33 | 0.45 | 0 |
| 86 | 12 | 2 | 0.45 | 0.51 | 0.51 | 0.14 | 0.43 | 0.48 | 0.51 | 0 | 0.29 | 0.37 | 0.51 | 0 |

Signed and Sealed this

Twenty-second Day of December, 1998

Attest:

BRUCE LEHMAN

Attesting Officer

Commissioner of Patents and Trademarks